US010612125B2

(12) United States Patent
Scherer et al.

(10) Patent No.: US 10,612,125 B2
(45) Date of Patent: Apr. 7, 2020

(54) LAYERED STRUCTURES FOR THE PROTECTION OF MOLECULES

(71) Applicant: California Institute of Technology, Pasadena, CA (US)

(72) Inventors: Axel Scherer, Pasadena, CA (US); Peter A Petillo, Lawrence, KS (US); Deepan Kishore Kumar, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 188 days.

(21) Appl. No.: 15/829,594

(22) Filed: Dec. 1, 2017

(65) Prior Publication Data

US 2018/0155819 A1   Jun. 7, 2018

Related U.S. Application Data

(60) Provisional application No. 62/429,163, filed on Dec. 2, 2016.

(51) Int. Cl.
| | |
|---|---|
| *C23C 14/14* | (2006.01) |
| *C23C 16/455* | (2006.01) |
| *C23C 14/34* | (2006.01) |
| *C23C 16/06* | (2006.01) |
| *C23F 1/00* | (2006.01) |
| *G03F 7/00* | (2006.01) |
| *C23C 14/16* | (2006.01) |
| *C23C 28/00* | (2006.01) |

(Continued)

(52) U.S. Cl.
CPC ............ *C23C 14/14* (2013.01); *C23C 14/165* (2013.01); *C23C 14/34* (2013.01); *C23C 14/5873* (2013.01); *C23C 16/06* (2013.01); *C23C 16/45525* (2013.01); *C23C 28/023* (2013.01); *C23C 28/42* (2013.01); *C23F 1/00* (2013.01); *G03F 7/0002* (2013.01)

(58) Field of Classification Search
CPC ....... C23C 14/14; C23C 14/165; C23C 14/34; C23C 14/5873; C23C 16/06; C23C 16/45525; C23C 28/023; C23C 28/42; C23F 1/00; G03F 7/0002; G05B 2219/34042; C08G 2340/00; G02B 2006/12109
See application file for complete search history.

(56) References Cited

U.S. PATENT DOCUMENTS

| | | |
|---|---|---|
| 2006/0055922 A1 | 3/2006 | Li et al. |
| 2007/0140900 A1 | 6/2007 | Wang et al. |

(Continued)

OTHER PUBLICATIONS

International Search Report issued for Patent Application No. PCT/US2017/064318, filed Dec. 1, 2017 on behalf of California Institute of Technology, dated Apr. 19, 2018. 6 pages.

(Continued)

*Primary Examiner* — Travis M Figg
(74) *Attorney, Agent, or Firm* — Steinfl + Bruno, LLP

(57) ABSTRACT

A multilayer structure can selectively bind certain molecules, due to reentrant spaces having an appropriate size. The multilayers can be fabricated by alternating layers of two different materials having different etching rate. The layers of the material having a higher etching rate form reentrant spaces which can protect molecules from further chemical interactions.

12 Claims, 9 Drawing Sheets

(51) Int. Cl.
*C23C 14/58* (2006.01)
*C23C 28/02* (2006.01)

(56) References Cited

U.S. PATENT DOCUMENTS

| | | |
|---|---|---|
| 2011/0217828 A1 | 9/2011 | Son et al. |
| 2012/0028450 A1 | 2/2012 | Son et al. |
| 2016/0111434 A1* | 4/2016 | Pachamuthu ..... H01L 27/11556 257/314 |

OTHER PUBLICATIONS

Written Opinion issued for Patent Application No. PCT/US2017/064318, filed Dec. 1, 2017 on behalf of California Institute of Technology, dated Apr. 19, 2018. 6 pages.

* cited by examiner (a)

(b)

LAYERED STRUCTURES FOR THE PROTECTION OF MOLECULES

CROSS REFERENCE TO RELATED APPLICATIONS

The present application claims priority to U.S. Provisional Patent Application No. 62/429,163, filed on Dec. 2, 2016, the disclosure of which is incorporated herein by reference in its entirety.

STATEMENT OF INTEREST

This invention was made with government support under Grant No. HR0011-15-2-0050 awarded by DARPA. The government has certain rights in the invention.

TECHNICAL FIELD

The present disclosure relates to biosensing. More particularly, it relates to layered structures for the protection of molecules.

SUMMARY

Figure 1:
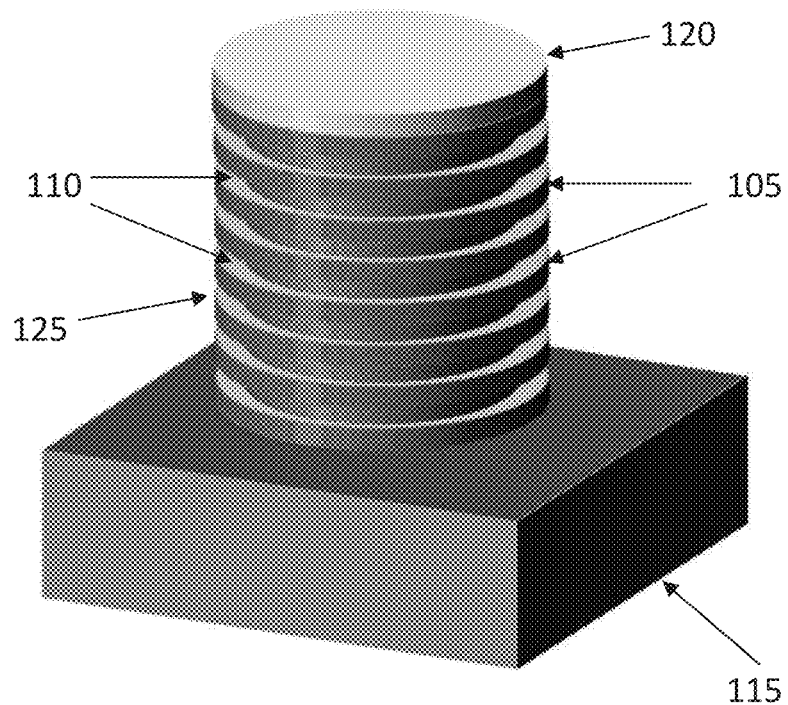
FIG. 1 illustrates an exemplary multilayer structure.

In a first aspect of the disclosure, a structure is described, the structure comprising: a substrate; a first plurality of layers of a first material; and a second plurality of layers of a second material different than the first material, wherein the first plurality of layers and the second plurality of layers alternate to form a multilayer vertical structure protruding vertically on top of the substrate and having reentrant spaces.

In a second aspect of the disclosure, a method is described, the method comprising: i) providing a substrate; ii) depositing on the substrate a first layer of a first material; iii) depositing on the first layer a second layer of a second material different than the first material, the second material having a higher etching rate than the first material; iv) depositing on the second layer a third layer of the first material; v) repeating steps iii)-iv) to form a multilayer; vi) patterning the multilayer into one or more multilayer vertical structures; and vii) by etching the one or more multilayer vertical structures, forming a plurality of reentrant spaces.

DETAILED DESCRIPTION

The capabilities of modern material deposition systems now enable the precise atomic control over the thicknesses of material used in structures and devices. Material deposition techniques include, for example, vapor deposition, sputter deposition, electrodeposition, as well as many other layer-by-layer deposition techniques (ALD—atomic layer deposition, CVD—chemical vapor deposition, VPE—vapor phase epitaxy, LPE—liquid phase epitaxy) that have been developed for different applications, such as in the semiconductor industry or magnetic media. Through these techniques, multilayered structures can be fabricated with atomic precision, and subsequently etched through to define nanoscale geometries with molecular dimensions. These fabrication methods provide an opportunity to engineer optimal structures and surfaces.

The present disclosure describes geometries and methods for the fabrication of structures which are configured to protect molecules from their surroundings. In some embodiments, the structures can have an increased surface area, due to the microfabrication methods employed. The increase in the surface areas where molecules can bind can lead to lower impedance contacts, where specific binding chemistries can be used, and reactions can be mechanically filtered. The present disclosure also describes methods for applying the above capabilities to design functionalized surfaces that can harbor and protect enzymes on the working electrode of an electrochemical sensing system. In another embodiment, the surfaces can also be functionalized to harbor and protect small molecule host systems that are capable of molecular recognition. The accompanying drawings, which are incorporated into and constitute a part of this specification, illustrate one or more embodiments of the present disclosure and, together with the description of example embodiments, serve to explain the principles and implementations of the disclosure.

In some embodiments, the present disclosure describes nanometer geometries with metal electrodes for manipulation, binding and protection of molecules. In some embodiments, the structures of the present disclosure comprise multilayers which consist of alternate metallic layers. In other embodiments, these structures can comprise insulator or semiconductor layers, depending on the specific application. Any combination of materials may be used, such as insulator and metal, semiconductor and metal, or other possible combinations of two or more types of materials. Structures may also be fabricated by using a single type of material, for example alternate layers of two different metals, two different insulators or two different semiconductors. In some embodiments, the structures may comprise a first region of alternate metallic layers, a second region of alternate semiconductor layers, and a third region of alternate insulator layers, or other combinations of two or more regions.

An exemplary structure is described in FIG. 1: A disk structure is etched through a multilayer that consists of two metals. The structure of FIG. 1 can be fabricated with nanometer-thickness layers by sputter deposition, vapor deposition, atomic layer deposition, or other techniques known to one of ordinary skill in the art, onto a conducting (or other type of) substrate, and subsequently etched through with a directional etch. For example, in FIG. 1 layers can alternate between two different materials, such as two metals. For example, layers of a first metal (105) alternate with layers of a second metal (110), deposited on top of a substrate (115). A top layer (120) may be fabricated out of a different material, for example gold, which is a standard metal for biological applications due to being inert and capable of being functionalized.

In some embodiments, the fabrication comprises deposition of multiple, alternate layers of two different materials. Subsequently, directional etching can be used to etch the multilayer to create, for example, the pillar structure of FIG.

1. After the fabrication steps involving directional etching of features into a multilayer structure consisting of alternate metals, one of the metals can be selectively dissolved, leaving thin fins of the other metal as shown in FIG. 1. In fact, it can be noted in FIG. 1 that layers of a first material are reentrant compared to layers of the second material. The structure comprising these reentrant spaces also looks like having fin-like layers (125).

For example, if the multilayer consists of platinum and nickel, most chemical etchants will preferentially attack nickel, leaving platinum fins exposed. Similarly, if copper and nickel are used, nickel will be attacked by most chemical etchants. Both nickel and copper enable selective binding through commonly used tags. For example, His-tags® comprise a polyhistidine-tag, an amino acid motif in proteins that consists of at least six histidine (His) residues, often at the N- or C-terminus of the protein. For biochemical compatibility, in some embodiments, inert multilayers may be defined in the multilayer structure. The inert layers can be fabricated with an inert material that does not dissolve when exposed to corrosive environments for long times.

In some embodiments, the structures of the present disclosure may be fabricated with alternate gold and platinum layers. For example, the person of ordinary skill in the art will know that gold is known to etch approximately 100 times faster than platinum in gold-etching solutions containing potassium iodide.

The distance between the fins of FIG. 1, for example platinum fins, can be determined by the thickness of the other material used in the multilayer, and can be, for example, as small as 5 nm or less. The first and second materials can be fabricated with, for example, nickel, copper, gold, titanium, tungsten, silicon nitride, silicon oxide or other oxides, platinum, silver, silicon, aluminum or other materials. In some embodiments, the distance between fins, or spacing, can be determined by the metal chosen as the first layer on the substrate. The difference in etching between the two materials can also determine the spacing between fins, according to the difference in etching rate. For example, if the etchant of choice attacks both materials but at different rates, the thickness of the first layer (and subsequent) layers of the material that is etched at a lower rate may determine the possible etching time that can be tolerated by that material.

In some embodiments, platinum can be replaced by other metals, including gold and tungsten, and other materials such as silicon, and the geometry shown in FIG. 1 can still be obtained as long as there is a substantial difference in the relative etching rates. It should also be noted that not only chemical etching, but also electro-chemical (anodic) etching can be used to obtain predictable and reproducible undercut geometries. In other words, if the layers of alternate materials have a similar etching rate to the specific etchant (chemical or physical) used, then it may not be possible to obtain reentrant spaces. On the other hand, if there is a significant etching differential between the two materials, then one material will etch faster than the other material, thereby creating reentrant spaces in the structure.

Figure 2:
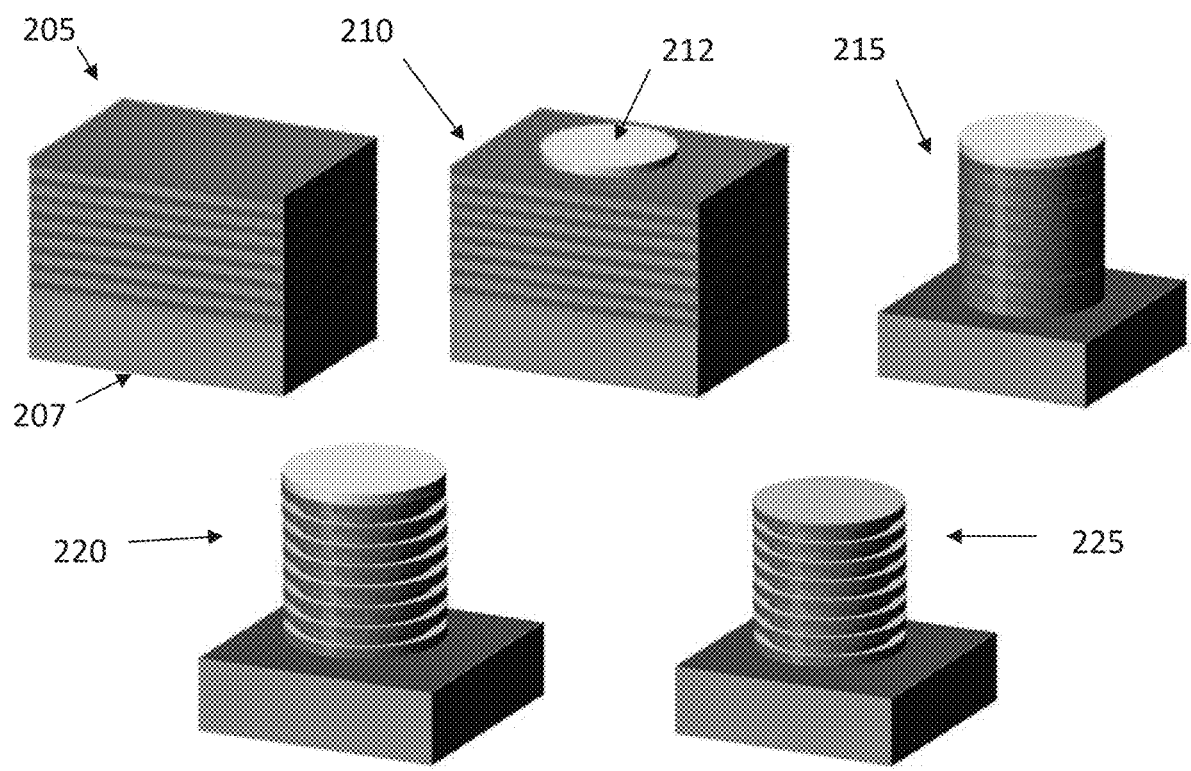
FIG. 2 illustrates an exemplary method of fabricating the structure of FIG. 1.

In some embodiments, with an automated deposition system, hundreds of layers can be deposited to define a multilayer structure that can be converted into the three-dimensional fin structure shown in FIG. 1. FIG. 2 illustrates an exemplary combination of deposition and lithography to fabricate the structure of FIG. 1. In some embodiments, the lithographic mask can be replaced with other masks, such as, for example, self-assembled or randomly deposited masks. The resulting multilayer can be patterned by sub-dividing the multilayer "sandwich" structure into smaller pillars (as shown in FIG. 2). In other embodiments, the pattern can be realized by drilling holes or other pattern shapes into the sandwich structure, and subsequently etching away the more dissolvable layer, leaving behind fins of the less reactive metal. In some embodiments, other geometrical shapes may be used instead of cylindrical pillars. For example, square, triangular, rectangular, or elliptical cross-sections may be used.

In some embodiments, the etching step can be carried out by using maskless tools, such as focused ion milling or other ablation techniques. In other embodiments, a lithographic process can be used, involving the deposition of a mask layer on top of the multilayer, perforating or etching through the multilayer, and subsequently removing the mask layer, if desired.

In some embodiments, it is possible to use the metal fin structures as a mechanical filter, to prevent larger molecules from interacting with the attached enzyme layer. The size of the reentrant spaces can be adjusted by varying the thickness of the layers making up the multilayer structure. In this way, the size of the reentrant spaces can be varied according to what molecules play a role in the specific application. For example, if molecules of size X should not be able to interact with the material forming the reentrant layers, the distance between layers (the thickness of the active material) can be adjusted accordingly. The etching of the active material can also be determined according to the desired depth of the reentrant space, which could also control the interaction between molecules and the active material. In some embodiments, the reentrant space may be sized so as to be smaller than the molecules which should not interact with the active material.

In some embodiments, it may be desirable to deposit an insulating layer that enables electrochemistry to only occur in the etched and recessed spaces, and not on the flat electrode surfaces. This filtering action requires the distance between fins to be designed to enable molecules of interest (smaller molecules) to diffuse through the gaps between fins, while preventing larger molecules from entering the protective fin layer. This approach can also be used to differentiate between other geometric variations of analytes, as molecules with different chirality may preferentially be chosen to interact with the metal surface. Filtering of molecules may be of interest either during the binding process, in which larger enzyme molecules can be excluded from surface binding. In other embodiments, filtering may also be of interest during the reaction process, in which small molecules may chemically interact with the functionalization molecules, whereas larger molecules will be excluded. In some embodiments, the structures of the present disclosure may be used to filter molecules from a liquid solution.

FIG. 2 illustrates an exemplary method of fabricating the structure of FIG. 1. For example, a multilayer (205) may be deposited by alternating two different materials, such as two metals, on top of a substrate (207). The substrate material may be the same or different than any of the two materials of the multilayer. In a subsequent step, a patterned electrode (212), such as a gold electrode, may be deposited on the multilayer (210). The multilayer may be shaped into a desired shape, such as a cylinder or pillar (215). In other embodiments, different shapes may be used, such as circular, elliptical, triangular, square, and rectangular cross-section, or an array of shapes, for example an array of cylinders. Shaping of the multilayer may be carried out in different ways, such as mechanical removal, or chemical or physical etching.

In a subsequent step, reentrant spaces may be realized in the multilayer, for example by directional or selective etching, with an etchant that is selective with regard to the materials comprised in the multilayer. For example, one of the materials may be etched at a significantly greater rate compared to the other material of the multilayer. An example of the resulting structure is illustrated in FIG. 2, (220). In an optional step, the multilayer structure may be treated with a further deposition step, for example passivation or functionalization. In some embodiments, part of the top layer may be removed, as illustrated in FIG. 2, (225).

In some embodiments, the entire multilayer structure may be covered in a filtering material or a diffusion limiting layer, for example a hydrogel or a polymer such as polyurethane, or other types of porous polymers or materials. The filter layer or diffusion limiting layer allows specific molecules to pass through and reach the reentrant spaces. For example, if a material comprises Pt layers and Ti layers, the Ti layers can be etched forming layers (110) as in FIG. 1. By selecting a filtering material or a diffusion limiting layer to cover both Pt and Ti layer, or alternatively only the Ti layer, a filter is created over the surface. The molecules of interest can move through the filtering layer and reach the surface underneath, for example to bind or otherwise interact with Ti. The filtering layer or a diffusion limiting layer, for example a hydrogel layer, further protects the molecules from the surrounding environment, by preventing other molecules from moving through the hydrogel. The porosity of the hydrogel can be controlled during fabrication, in order to tailor it to the specific molecules allowed to go through, or which should be prevented from pass through. The hydrogel can be synthetic or naturally occurring.

In these embodiments, the non-reentrant spaces may be passivated to prevent interaction with molecules, in order for the size-filtering of the reentrant spaces to be more effective. In some embodiments, hydrogels or polymers may be used for passivation. In some embodiments, the polymer may be applied limitedly to the non-reentrant spaces, the reentrant spaces, or to both. In some embodiments, different polymers may be applied to the reentrant spaces and the non-reentrant spaces. A functionalization layer may also be deposited underneath the hydrogel, for example between the Ti layer and the porous hydrogel.

As a flat surface is patterned in three dimensions, the surface area is increased. This can have some implications in electrochemical systems, where surface area translates into impedance between the contact surface and the surrounding electrolyte. The fabrication method using selective etching of multilayers can result in very high surface areas, if the deposition and etching conditions are controlled at the nanoscale. The surface area increase expected by (a) patterning the surface with pillars and (b) patterning these pillars with the disk-shaped grooves described above can lead to an increase factor of 10-100 or more when a flat surface is patterned with pillars or cups. In some embodiments, this surface area can be further increased by over a factor of ten by corrugating the sidewall of the pillars.

The contact resistance between a metal contact and a solution is generally determined, among other factors, by the area of the contact. This area can be significantly increased by performing the multilayer deposition and perforation described above. The increase in the contact area can improve measurements of voltages, by increasing signal-to-noise statistics of such measurements. It is also possible to determine the geometry during the fabrication process and to control the selective etching of one of the metal components in-situ, according to the impedance values necessary for the specific application. For many applications, such as electrophysiology, contact impedance provides a fundamental limitation to the sensitivity of the voltage measurement, or the amount of current that can be injected through a contact. These factors have, in the past, limited the miniaturization of electrochemical contacts in many applications, leading to relatively bulky devices. By fabricating the three-dimensional structures described in the present disclosure, it is possible to reduce the real-estate area of electrodes on a device, without reducing the contact area, thereby improving the performance of the electrochemical contact.

As known to the person of ordinary skill in the art, enzymes can be modified to include surface binding sites that enable selective or non-selective binding to metal surfaces. For example, a known binding chemistry is based on the thiol-bond on gold surfaces, which can be enabled by forming a cysteine-tether on the molecule of interest. Another exemplary binding chemistry, used in the purification of enzymes, is based on the His-tag® (typically His-6, His-9, His-10, His-12, His-14 or similar chains). In another embodiment, peptides can be introduced on the C-terminal or N-terminal portion of the enzyme that targets a particular metal surface. An optional linker can be used to provide spacing between the metal binding peptide and the body of enzyme. The linker can be of variable length as dictated by the needs of the binding reaction. Several binding chemistries can be identified and optimized to serve as specific metal surface tethers for molecules of interest. The present disclosure describes the use of metal binding sites on enzymes and other molecules, to attach them selectively onto the large surface-to-volume geometries provided by the layered structures described above. Non-selective binding on metals takes advantage of the larger surface areas, enabling more molecules to be deposited onto an electrode surface. On the other hand, selective metal binding sites enable such molecules to be attached to the back-etched metal only (the reentrant spaces), enabling these molecules to be protected from direct chemical interaction with the chemical environment surrounding the metal nanostructures. In other words, the molecules attach to the reentrant layers and are protected, to a degree, by the non-reentrant spaces. For example, the chemical environment surrounding the structures may be a liquid comprising reactive species. The molecules bound within the reentrant spaces, or circular grooves for the example of cylindrical structures, are protected by their limited interaction with the reactive species in the surrounding liquid, compared to molecules freely floating in the liquid. In this way, the structures described in the present disclosure, such as the structure of FIG. 1, can provide protection of certain molecules, depending on the material selection and geometrical dimensions of the multilayer and corresponding grooves.

An advantage provided by metal-binding of enzymes and other biological molecules onto large surface-to-volume nano-geometries is the relative simplicity of the functionalization process. Instead of dipping or spinning precise layer thicknesses onto the electrode surfaces, the area to be functionalized can be exposed to the tagged biochemistry, and electrodes are coated automatically. In some embodiments, the exposure to the biochemical fluids containing the tags to be applied to the nanostructure is a relatively simpler fabrication process compared to automatic dipping or spinning, for example with a robotic process. The simpler application of tags via biochemical functionalization is enabled by the multilayer structures described in the present disclosure.

The biochemical functionalization process may require specific application times, depending on the concentration of the material in solution, as well as on the amount of functionalizing polymer, molecule, biomolecule or other organic material desired. In some embodiments, the biochemical functionalization process does not require any further post-processing (such as baking, encapsulation, etc.) after the tag exposure. In other embodiments, the tags to be deposited should be stable over the timeframe required for the coating process.

An alternative, exemplary method for coating the multilayer structures involves electrophoretic assistance to the diffusion process. In this approach, an electrostatic field is applied onto the electrode to be coated, and the molecules of interest are rendered electrostatically active through either the addition of a metal ion or an appropriate charged molecule. The electrophoretic approach enables the efficient accumulation of functionalization agent to the charged metal surface, and can be used to increase the speed of the functionalization process. In some embodiments, it may be preferred to only functionalize the undercut region (the reentrant spaces). For example, an insulator can be deposited onto the multilayer surface before the perforation, or undercutting, of the grooves. Subsequently, the electrophoretic process can be applied.

In some embodiments, electrochemical functionalization can also be carried out if different chemistries are to be deposited onto different areas, as would be the case in a multiplex assay. In these embodiments, chemistries of interest can be exposed to the electrode surfaces, and different electrodes are electrostatically activated to enable coating of these surfaces with the desired chemistry. As understood by the person of ordinary skill in the art, the term "chemistry" in these examples refers to specific molecules and liquids being used, for example the thiol-bond on gold surfaces chemistry. This electrolytic approach can be used to avoid the need for lithographic patterning or more complex approaches to selectively change the surface chemistries of surfaces of interest.

In some embodiments, the present disclosure describes how the structures can be used in biosensors that measure peroxide. For amperometric biosensors that rely on the measurement of peroxide, the efficiency of the peroxide capture at the metal surface is a significant determinant of the overall signal observed for a biosensor. Peroxide is a by-product of the reaction of an oxidase protein and oxygen on the enzyme's substrate. Since the oxidase enzyme produces one molecule of peroxide per molecule of substrate molecule reacted, interrogation of the peroxide concentration yields a 1:1 relationship between the number of substrate molecules processed and the number of peroxide molecules monitored. Unfortunately, historical estimates suggest that the amount of peroxide that is lost by diffusion to the surrounding environment on a second-by-second basis is upwards of 90% of the total peroxide generated by the oxidase enzyme. This peroxide is lost, and the result is that a conversion factor that is a measure of the peroxide capture efficiency needs to be established to properly convert the observed current into an actual concentration at the monitored substrate. Furthermore, the loss of the peroxide reduces the overall observable signal.

Few strategies currently exist that promote the enhanced capture of enzyme generated peroxide. The present disclosure advantageously describes how biosensors based on the detection of peroxide can be greatly improved thanks to the multilayer structures described herein. The geometries of the devices described herein can be fabricated to both promote and enhance the peroxide capture, by virtue of (1) proximity of the oxidase enzyme to the sensing surface, and (2) recessing of the oxidase enzyme away from the bulk environment (by the reentrant spaces). The enhancement in the capture of the peroxide leads to an enhanced signal on a surface area to surface area basis, compared to devices without enhanced peroxide capture. The enhanced peroxide capture also promotes enhanced oxygen recycling.

A major impediment to the deployment of enzyme-based sensors for use in biological systems is the Km (Michaelis constant) problem. As understood by the person of ordinary skill in the art, if the amount of enzyme is kept constant and the substrate concentration is gradually increased, the reaction velocity will increase until it reaches a maximum. At this maximum velocity, all of the available enzyme has been converted to the enzyme-substrate complex. The Michaelis constant Km is therefore defined as the substrate concentration at ½ the maximum velocity. A small Km indicates that the enzyme requires only a small amount of substrate to become saturated. For a small Km, the maximum velocity is reached at relatively low substrate concentrations. By contrast, a large Km indicates that a high substrate concentration is required to achieve the maximum reaction velocity. The Km of the enzyme can therefore be considered as an inverse measure of affinity.

For oxidase enzymes, the amount of local, dissolved oxygen limits the Km of the enzyme. This in turn limits the maximum concentration of substrate that the enzyme can effectively monitor, which is often lower than what is required for complete monitoring of said substrate. This is best exemplified by glucose oxidase, which has a Km of about 8 mM, thereby limiting reliable readings to a concentration of less than 8 mM glucose. The value of 8 mM is much lower than is needed to monitor a diabetic patient, where the actual linear range needed for a functioning glucose monitor is at least 28 mM glucose. Many different strategies have been deployed to engineer around this problem. The most common solution is to coat the sensing cavity containing the enzyme with a diffusion limiting layer that slows the flux of glucose to the enzyme. This effectively extends the linear range of the sensing device, albeit at the cost of sensitivity and response of the biosensor.

The amperometric measure of peroxide in a biosensor produces oxygen as a by-product of the measurement. This oxygen can in principle be used to increase the local concentration of oxygen, and by extension, the Km of the enzyme. Enabling technologies that promote oxygen recycling have shown that the Km (and therefore the linear range) of glucose oxidase can be extended to as high as 80 mM glucose. The geometries of the devices described in the present disclosure both promote and enhance oxygen recycling, by virtue of (1) proximity of the oxidase enzyme to the sensing surface, and (2) recessing of the oxidase enzyme away from the bulk environment.

The enhancement of the linear range of an oxidase enzyme by promoting oxygen recycling can be advantageous for the interrogation of small substrates, such as lactate and glucose, which are involved in the homeostasis of mammalian systems. For these substrates, the in vivo linear range of the enzyme is always below what is needed for complete coverage of the biological system. Rationally designed oxygen recycling that is promoted by the structure designs described in the present disclosure provide a strategy that enables the extension of the linear range of the sensors, without compromising the sensitivity or response of the device.

Figure 3:
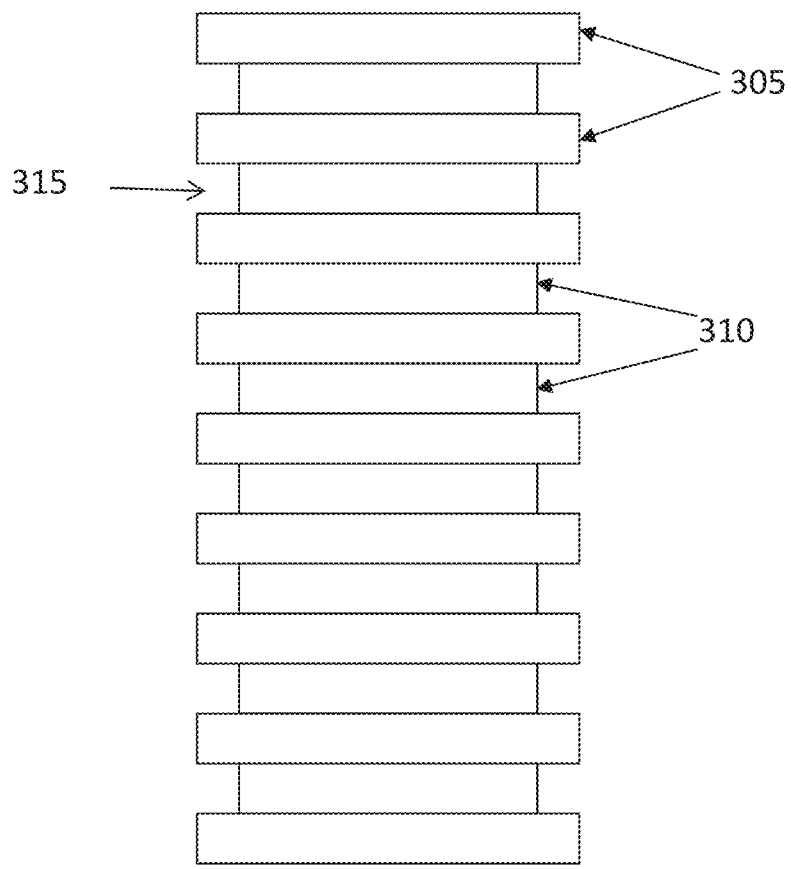
FIG. 3 illustrates a side view of the exemplary structures of FIGS. 1-2.

FIG. 3 illustrates a side view of the exemplary structures of FIGS. 1-2. In FIG. 3, an exemplary structure with layers (305) and alternate layers (310). Layers (305) have a reduced etching rate compared to layers (310), allowing the formation of reentrant grooves (315).

In some embodiments, the layers of either one of the first or second material may also comprise a third material. For example, the layers in FIG. 1 having a larger diameter may comprise two or more materials having similar etching rate. Alternatively, the layers in FIG. 1 having a smaller diameter may comprise two or more materials having a similar etching rate. In other embodiments, both layers in FIG. 1, the layers having smaller and larger diameters, may comprise two or more materials.

Figure 4:
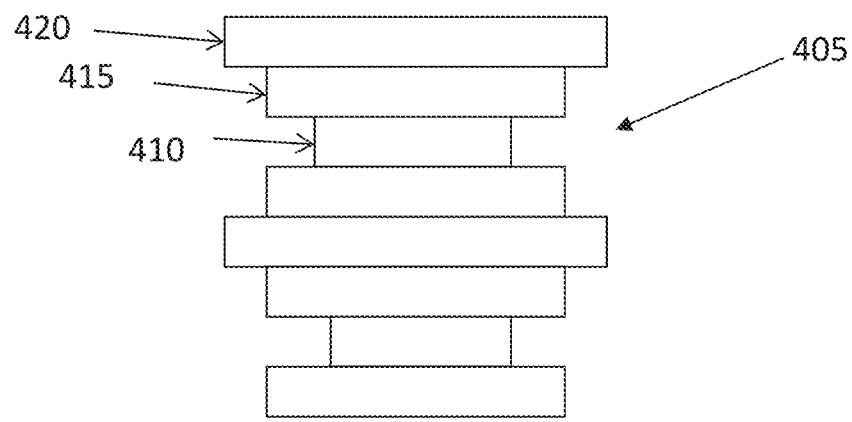
FIG. 4 illustrates exemplary multilayer structures.
Figure 4:
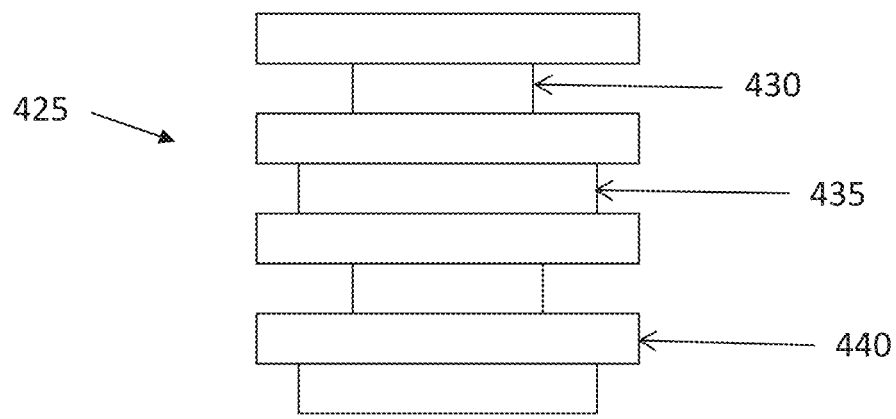

In yet other embodiments, more complex structures may be fabricated by alternative three or more materials, forming reentrant spaces having steps. For example, FIG. 4, panel (a) illustrates a first exemplary structure (405) having a smaller layer (410) that is more reentrant than adjacent layers (415) and (420). FIG. 4, panel (b) illustrates a second exemplary structure (425) with layers (430) and (435) having different reentrant spaces compared each other and to layer (440) in the same multilayer structure.

In some embodiments, the size of the reentrant spaces is larger than a first molecule, thereby allowing the first molecule to enter the reentrant spaces, and smaller than a second molecule, thereby preventing the second molecule from entering the reentrant spaces.

In some embodiments, as illustrated in FIG. 2, a patterned layer may be deposited on top of the multilayer. For example, a gold layer may be deposited, and subsequently patterned with a circular cross-section. The multilayer structure could then be patterned by using the circular gold layer as a mask. The person of ordinary skill in the art will understand that different variations may be carried out to fabricate the structures, and that FIG. 2 is an example of such fabrication techniques.

Figure 5:
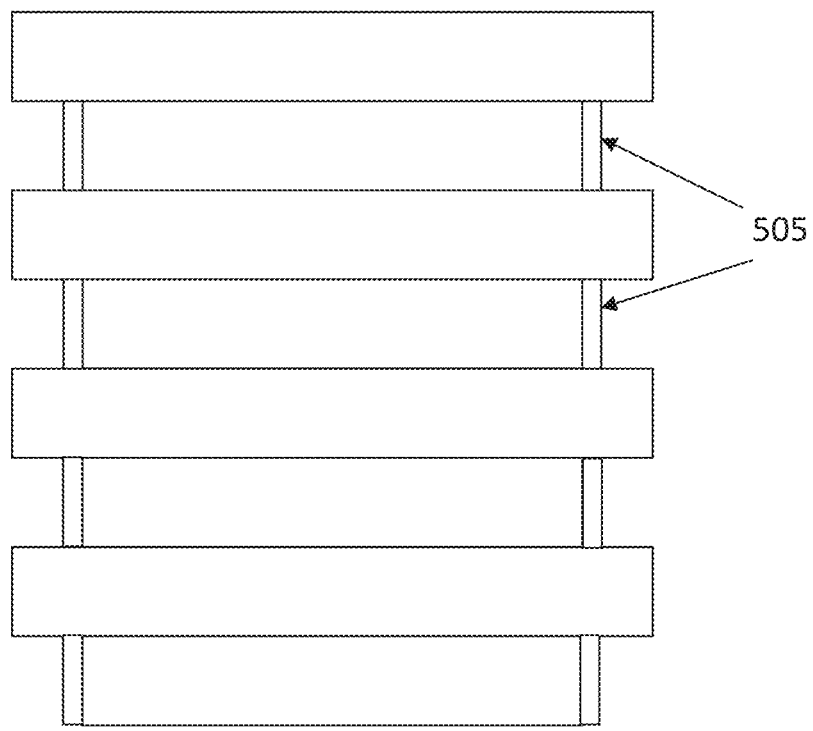
FIG. 5 illustrates an example of a functionalization layer on a multilayer structure.

In some embodiments, the reentrant spaces may be configured to bind to certain molecules, so that the multilayer structures can act as filters to remove such molecules from a liquid. For example, as illustrated in FIG. 5, a functionalization layer (505) may allow selective binding of specific molecules. Similarly, layer (505) could instead be a porous hydrogel or other filtering porous material.

In some embodiments, the deposited multilayers are for increasing the surface area of a device, or for storage and protection of molecules. The multilayers can comprise different metals that are deposited sequentially through vapor deposition, sputter deposition, or other chemical or electrochemical deposition methods. The deposited multilayers of metals can be selectively etched to form nanometer-scale fins with desired geometric distances between fins (down to 5 nm or less). For example, in some embodiments, each layer of the multilayer structure may range in thickness between 1 and 500 nm. In some embodiments, the thickness of each layer may be between 1 and 100 nm, or other ranges. In other embodiments the thickness of each layer may be between 1 and 50 nm. In yet other embodiments the thickness of each layer may be between 1 and 5 nm. In some embodiments, the thickness of each layer may be between 10 and 25 nm. In some embodiments, the size of the reentrant spaces determines what molecule can enter these spaces. Therefore, the size can be selected according to the molecule or molecules which should be allowed in the grooves, and the size of the molecules which should be prevented from entering the grooves. In other embodiments, the material within the grooves, or the functionalization layer, also plays a role in what molecule is filtered or otherwise protected from interactions with the surrounding environment. Therefore, the size of the grooves, as well as the choice of materials, and optional layers such as the functionalization layer or the passivation/filtering layer, are chosen according to the application of interest, and which molecules should be allowed to bind to the structure or not.

In some embodiments, the multilayer comprises alternating layers of Pt and Ti layers, with the smaller diameter layers being fabricated with Ti. In other embodiments, Ni may be used instead of Ti, although Ti may have advantages compared to Ni with regard to biocompatibility.

The multilayers can be used for the attachment of biologically interesting molecules using thiol, His-tags® or other binding chemistries. Such chemistries enable the adhesion of molecules to the surface of either the etched metal, the un-etched metal, or both. In some embodiments, fabrication techniques can comprise perforation of the multilayers to enable the deposition of functionalization chemistries on to the surface of the fins formed for maximum surface storage of molecules.

Patterning of the multilayers can be carried out by subdividing the multilayers into different "pillar" structures. Drilling, patterning or perforation of multilayers can be carried out, for the purpose of mechanical filtering of different sizes or chiralities of molecules during deposition of the functionalizing species. Drilling, patterning or perforation of multilayers can also be carried out for the purpose of mechanical filtering of different molecule sizes or chiralities during reaction of chemistries with functionalizing species.

Electrophoretic deposition of molecules of interest can also be carried out, through the addition of positive or negative charges to the molecules to speed up the functionalization process. Electrophoretic deposition of bio-molecules can be carried out, through design of charged molecules to increase the density or control the orientation of bio-molecules. Electrophoretic deposition of molecules of interest can be carried out for the purpose of functionalization without the need for lithography and masking.

In some embodiments, the fabrication process may comprise deposition and patterning of an insulating layer on the surface of the multilayer structures, to expose only etched material and not the original un-patterned surface to the chemistry of interest.

Patterning and/or perforation of multilayers can be followed by selective etching to form fins to protect molecules from being attacked by oxidizing species. Patterning and/or perforation of multilayers can also be followed by selective etching to form fins to reduce the lifetime of corrosive ions (hydrogen peroxide, ammonia, etc.) formed by local reactions.

In some embodiments, patterning and/or perforation of multilayers followed by selective etching to form fins is to increase the capture of peroxide on the sensing surface of a device, to increase the sensitivity and the efficiency of the device. In some embodiments, patterning and/or perforation of multilayers followed by selective etching to form fins is to increase the capture of peroxide as a mechanism of promoting oxygen recycling.

In some embodiments, patterning and/or perforation of multilayers followed by selective etching to form fins is to increase the oxygen recycling and prevent oxygen depletion from reducing the efficiency of enzymatic reactions. In some embodiments, patterning and/or perforation of multilayers followed by selective etching to form fins is to increase the oxygen recycling as a method to increase the linear range of oxidase enzymes. In some embodiments, patterning and/or perforation of multilayers followed by selective etching to form fins is to avoid selective dissolution and escape of molecules (co-factors, etc.) necessary for completion of a reaction of interest.

In some embodiments, patterning and/or perforation of multilayers followed by selective etching of electrodes to form fins is to enable lower impedance voltage measurements. In some embodiments, patterning and/or perforation of multilayers using impedance is to measure depth of fins for better reproducibility of contact performance.

Figure 6:
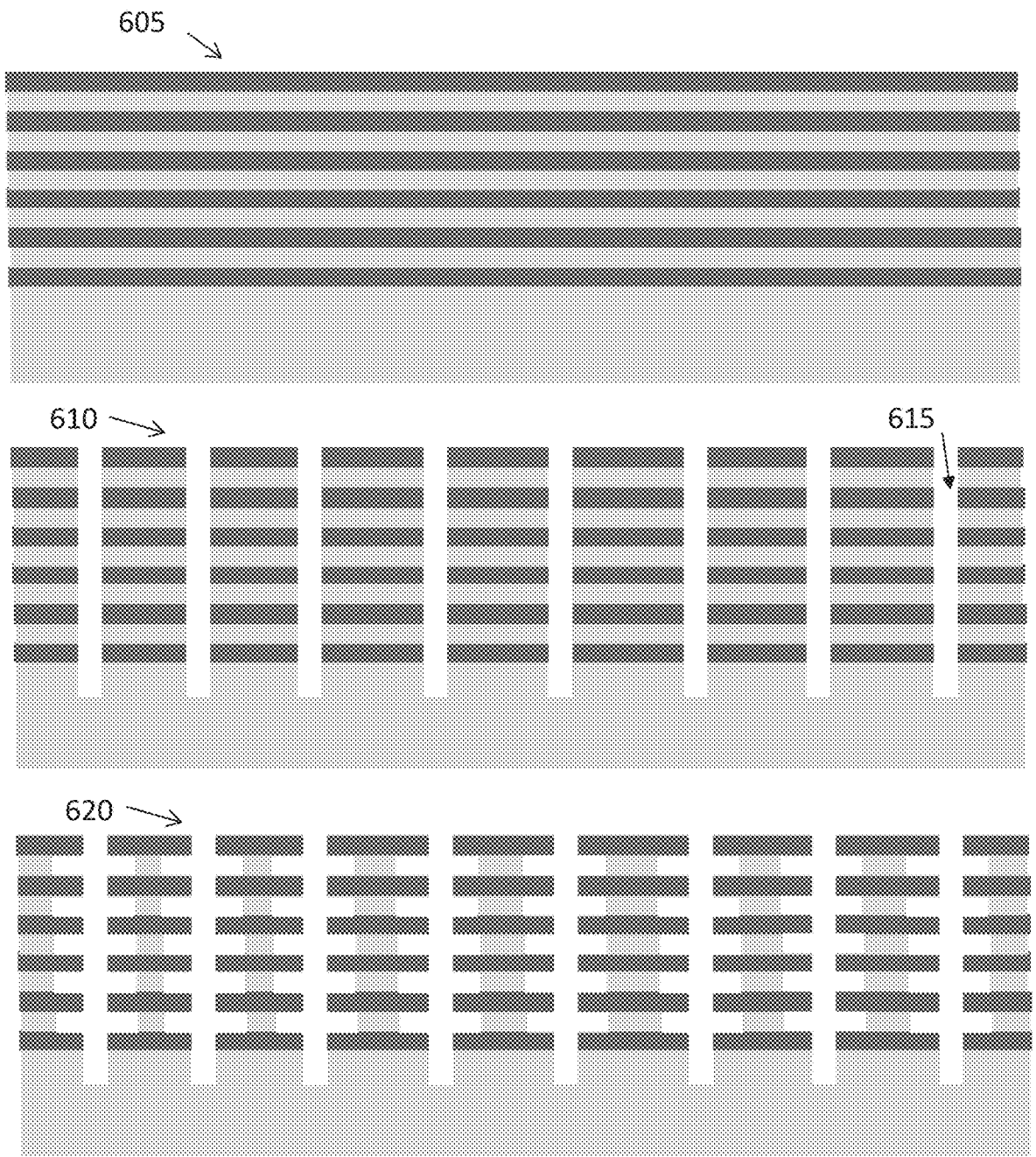
FIG. 6 illustrates an exemplary array of structures.

FIG. 6 illustrates fabrication steps of an exemplary array of multilayer structures. In a first step (605) multiple layers of alternating materials, as described above in the present disclosure, are deposited or otherwise fabricated on a substrate. In a subsequent step, holes (615) are etched in the structure (610). In a following step (620), the sacrificial material is selectively etched. For example, one of the layers is etched at a much higher rate than then the other material. In some embodiments, the cross section view of FIG. 6 can refer to an array of structures, such as an array of pillars having a circular cross section or a rectangular cross section. In these embodiments, the holes etched in (610) can be, for example, in the shape of a hollow cylinder, leaving the multilayer material within each hollow cylinder, to form an array of pillars.

Figure 7:
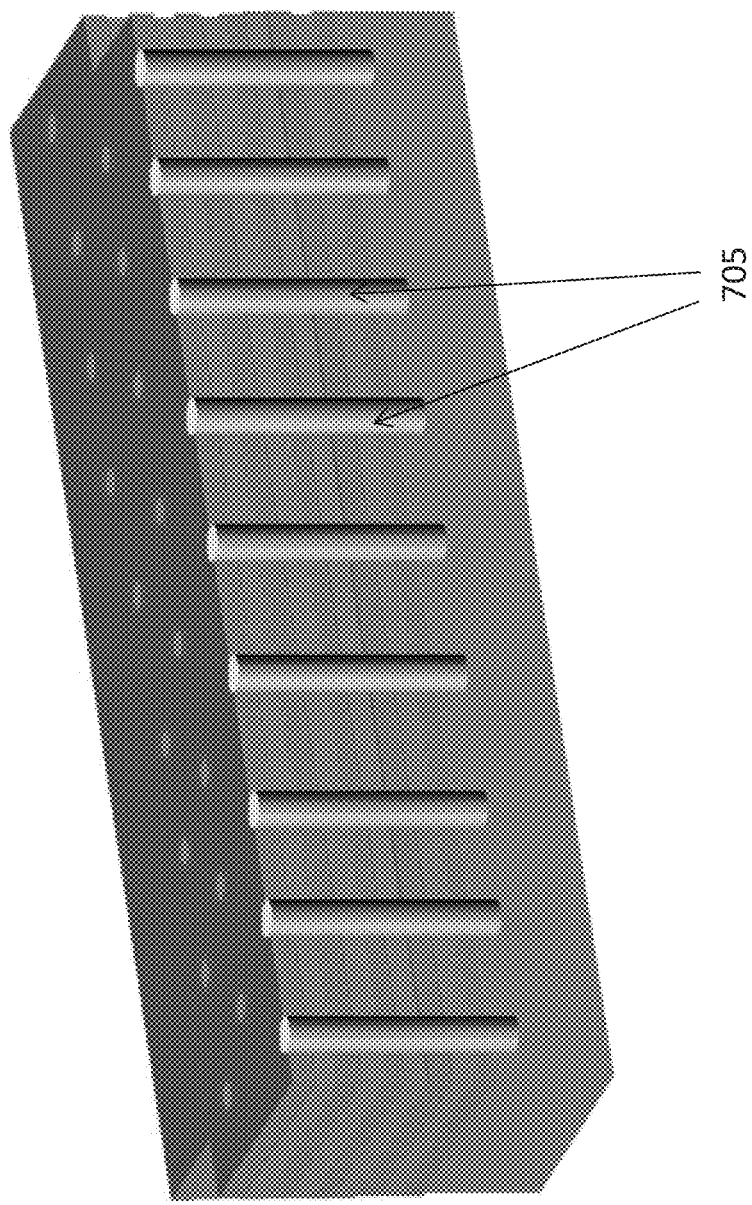
FIG. 7 illustrates a multilayer structure with holes.

In other embodiments, the example of FIG. 6 refers to a structure having holes etched or drilled into. In these embodiments, the holes etched are, for example, hollow cylinders. In these embodiments, the holes allow access to the multilayers. For example, the molecules may diffuse into the holes and interact with the multilayer, as described above in the present disclosure. In these embodiments, a perspective view of step (610) is illustrated in FIG. 7. In FIG. 7, etched or drilled holes (705) are illustrated in a perspective cross section.

Figure 8:
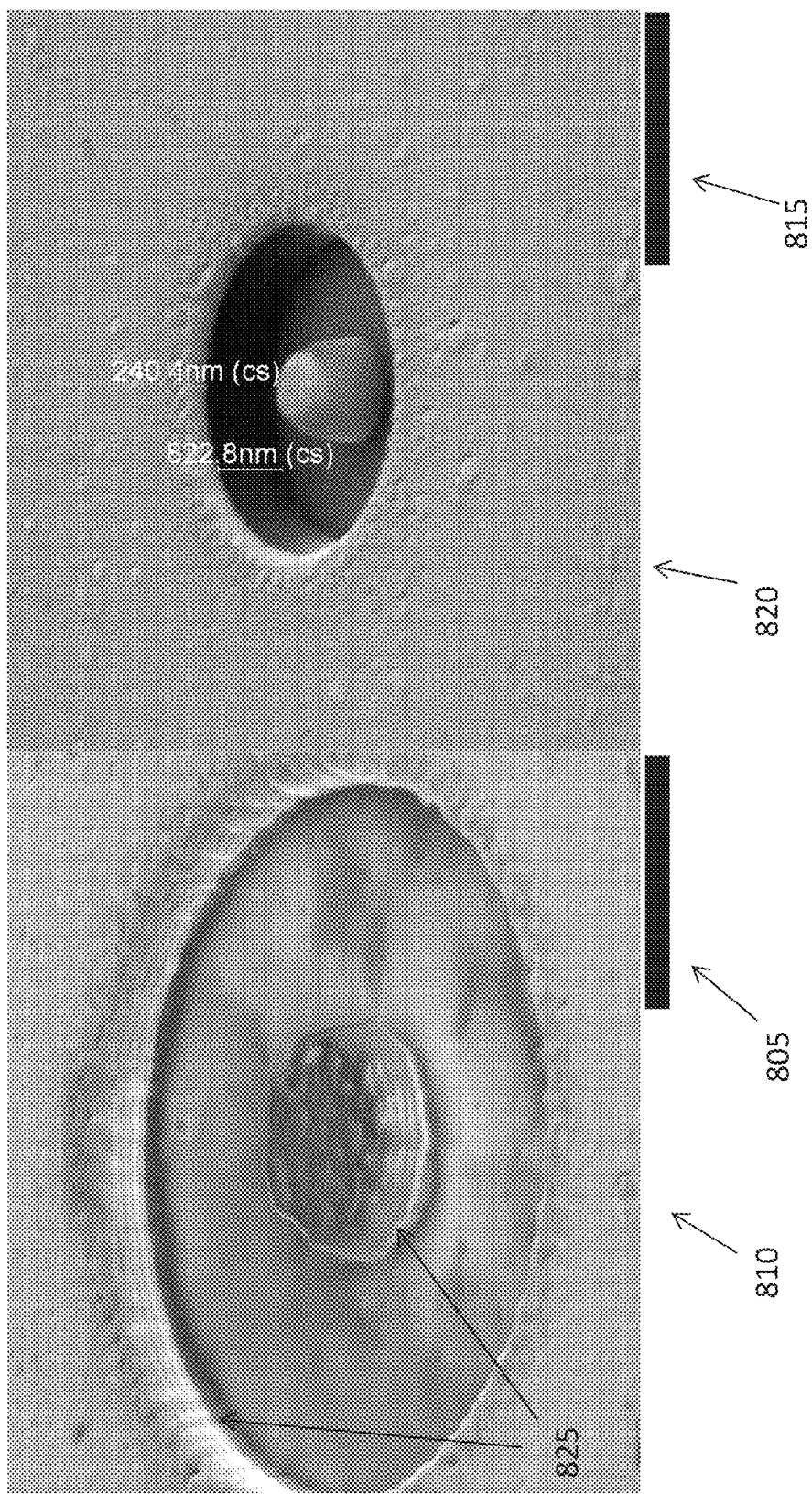
FIGS. 8-9 illustrate scanning electron microscope pictures of multilayer structures.

FIG. 8 illustrates scanning electron microscope pictures of exemplary multilayers. The black bar (805) for picture (810) represents a reference of 1 micrometer. The black bar (815) for picture (820) represents a reference of 2 micrometer. In the embodiment of FIG. 8, both the central pillar and the surrounding multilayer structure display multilayers which can be etched to form reentrant spaces (825).

Figure 9:
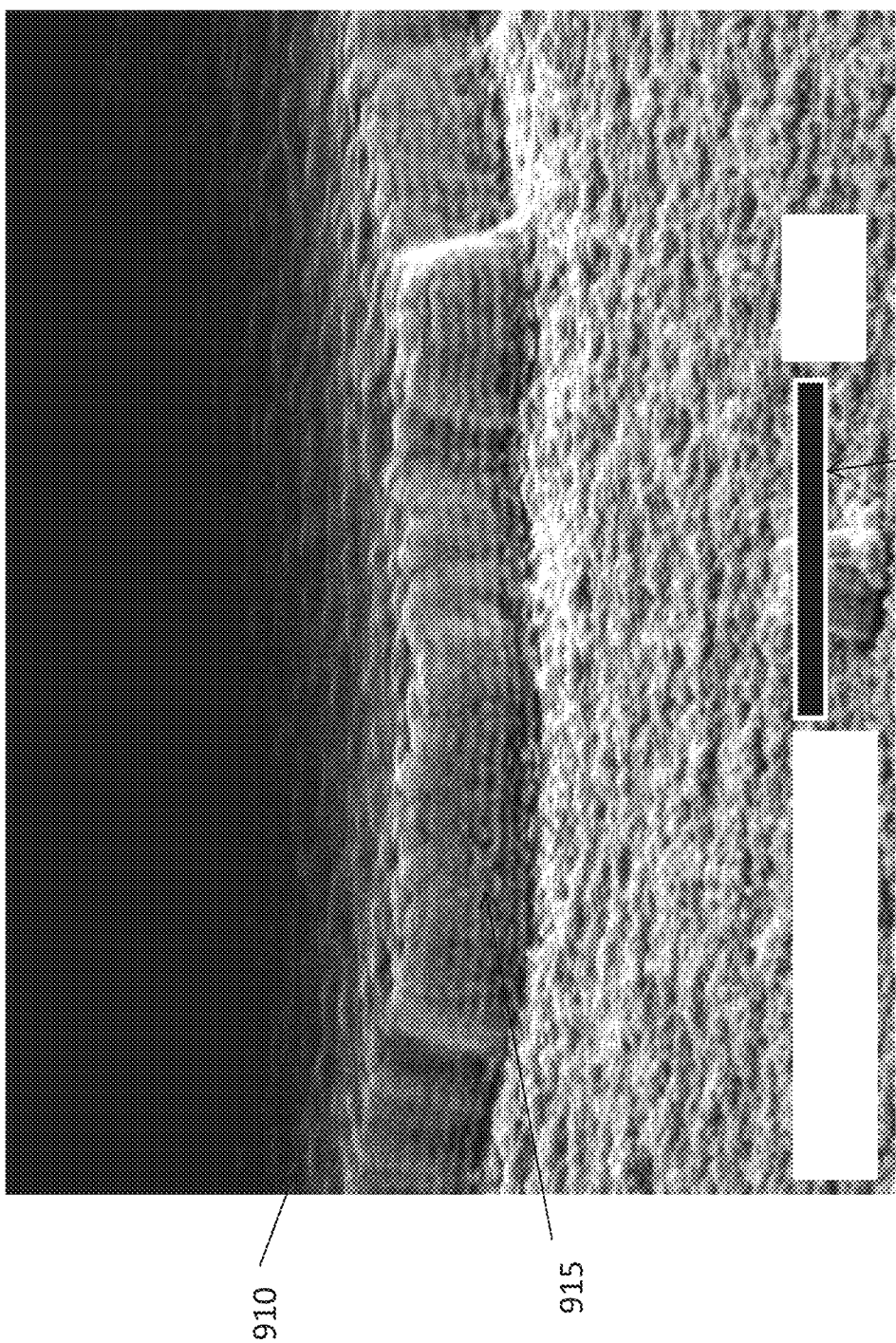

FIG. 9 illustrates a scanning electron microscope picture of a multilayer structure (910). The multiple layers are illustrated (915). The black bar (905) represents a reference of 1 micrometer.

In some embodiments, the multilayer structures of the present disclosure can be fabricated with a sputter deposition system with two targets. The sputtering chamber can deposit Ti and Pt in sequence, to form multilayers with desired thickness. For example, the multilayer can be fabricated with 20 nm Ti layers alternating Pt layers. The Ti layers can be selectively etched in a subsequent step, to protect enzymes with a titanium-binding peptide tag. For example, ion etching can anisotropically etch the Pt/Ti multilayers with high resolution, using a lithographic mask that can pattern, for example, an 8" wafer.

In some embodiments, the formation of reentrant spaces effectively increases the surface area for binding and collection of molecules or ions. Therefore, the multilayer structures of the present disclosure can be utilized to increase the surface area and, in turn, the efficiency of the structures.

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure, and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

What is claimed is:

1. A structure comprising:
a substrate;
a first plurality of layers of a first material; and
a second plurality of layers of a second material different than the first material,
wherein the first plurality of layers and the second plurality of layers alternate to form a multilayer vertical structure protruding vertically on top of the substrate and having reentrant spaces, and
wherein the first material is platinum and the second material is gold.

2. The structure of claim 1, wherein a size of the reentrant spaces is configured to be:
larger than a first molecule, thereby allowing the first molecule to enter the reentrant spaces, and
smaller than a second molecule different from the first molecule, thereby preventing the second molecule from entering the reentrant spaces.

3. The structure of claim 1, wherein an etching rate of the first material is less than the etching rate of the second material.

4. The structure of claim 1, wherein the multilayer structure has a circular, elliptical, triangular, square, or rectangular cross-section.

5. The structure of claim 1, further comprising a layer of a third material deposited on a top surface of the multilayer vertical structure.

6. The structure of claim 5, wherein the third material is gold.

7. The structure of claim 1, further comprising a functionalizing agent on one or more layers of the first or second plurality of layers.

8. The structure of claim 1, wherein a thickness of each layer of the first and second plurality of layers is between 1 nm and 500 nm.

9. The structure of claim 1, wherein a thickness of each layer of the first and second plurality of layers is between 10 nm and 25 nm.

10. The structure of claim 1, further comprising a filtering material on one or more layers of the first or second plurality of layers, wherein the filtering material is permeable to a first molecule, thereby allowing the first molecule to enter the reentrant spaces, and not permeable to a second molecule different from the second first molecule, thereby preventing the second molecule from entering the reentrant spaces.

11. A device comprising an array of multilayer vertical structures as in claim 1.

12. A structure comprising:
   a substrate;
   a first plurality of layers of a first material; and
   a second plurality of layers of a second material different than the first material,
   wherein the first plurality of layers and the second plurality of layers alternate to form a multilayer vertical structure protruding vertically on top of the substrate and having reentrant spaces, and
   wherein the first material is platinum and the second material is titanium.

* * * * *